(12) United States Patent  
Kishishita

(10) Patent No.: US 8,063,416 B2  
(45) Date of Patent: Nov. 22, 2011

(54) SEMICONDUCTOR DEVICE

(75) Inventor: Keisuke Kishishita, Kyoto (JP)

(73) Assignee: Panasonic Corporation, Osaka (JP)

( * ) Notice: Subject to any disclaimer, the term of this patent is extended or adjusted under 35 U.S.C. 154(b) by 309 days.

(21) Appl. No.: 12/255,911

(22) Filed: Oct. 22, 2008

(65) Prior Publication Data

US 2009/0173972 A1    Jul. 9, 2009

(30) Foreign Application Priority Data

Jan. 7, 2008    (JP) .................... 2008-000349

(51) Int. Cl.
*H01L 23/535* (2006.01)
(52) U.S. Cl. .............. 257/207; 257/211; 257/E23.153
(58) Field of Classification Search ............ 257/207, 257/208, 211, E23.153
See application file for complete search history.

(56) References Cited

U.S. PATENT DOCUMENTS

2006/0181309 A1    8/2006    Nakanishi
2007/0033548 A1*   2/2007    Tatsumi ...................... 716/1
2007/0096154 A1    5/2007    Shimbo et al.

FOREIGN PATENT DOCUMENTS

JP           2003-309178 A      10/2003

* cited by examiner

*Primary Examiner* — Benjamin Sandvik
*Assistant Examiner* — Wensing Kuo
(74) *Attorney, Agent, or Firm* — McDermott Will & Emery LLP

(57) ABSTRACT

In a substrate power supply cell, a portion of a substrate power supply wiring is exposed by forming a power supply wiring in a U-shape, and a connection portion to an upper-layer wiring is provided at a boundary portion of the substrate power supply cell. Thereby, a leakage current is reduced without a decrease in signal wiring efficiency.

8 Claims, 15 Drawing Sheets

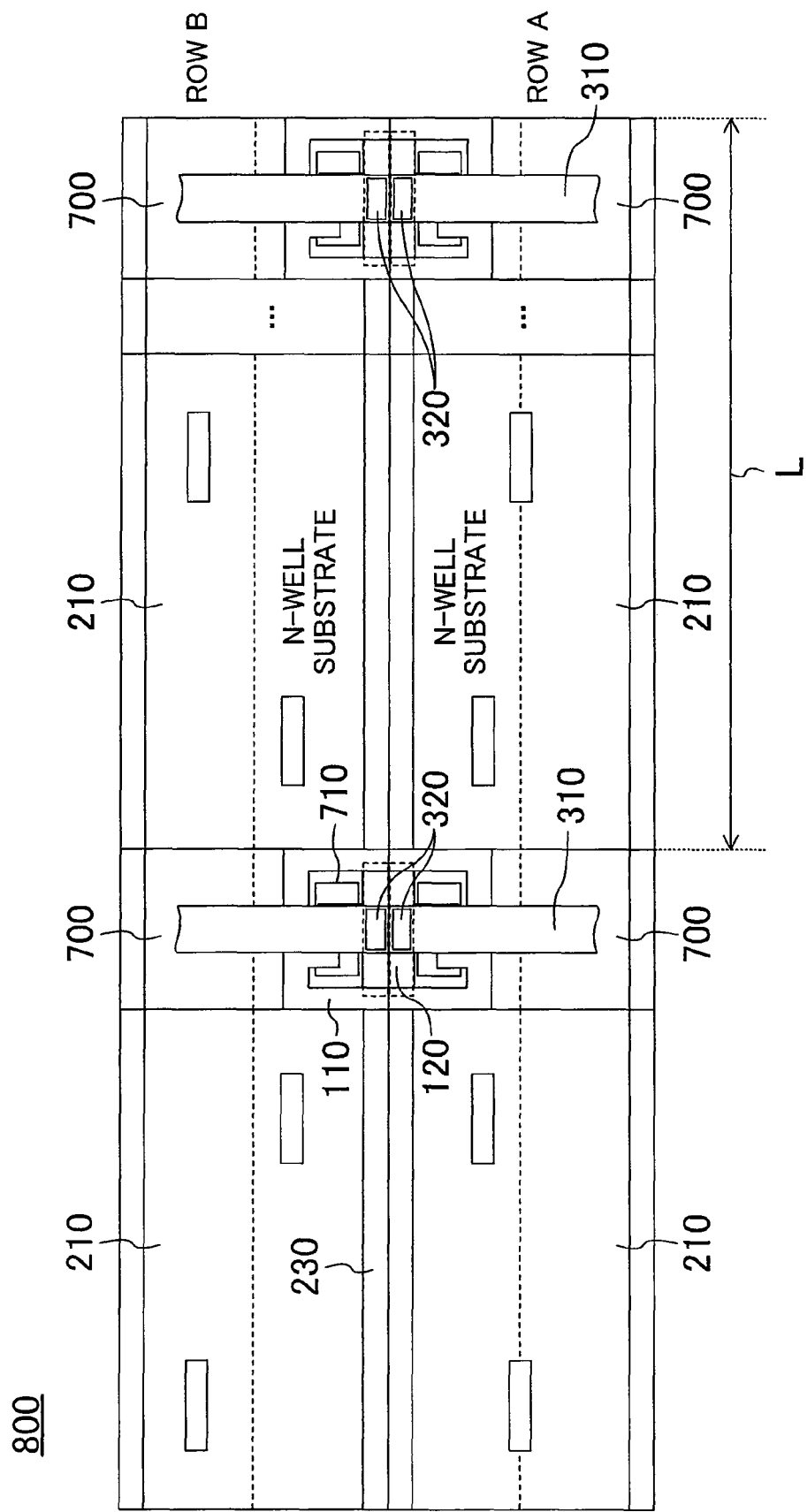

SEMICONDUCTOR DEVICE

BACKGROUND OF THE INVENTION

1. Field of the Invention

The present invention relates to a layout configuration of a semiconductor device, and more particularly, to a configuration of wirings and contacts for providing substrate power supply or normal power supply to a semiconductor device.

2. Description of the Related Art

In recent years, as a semiconductor device has been further miniaturized, an increase in power consumption has become more significant due to an increase in leakage current. Therefore, in order to suppress the increase of the leakage current, the well substrate potential of a semiconductor device is changed to a value that is different from a power supply voltage so that a threshold voltage with respect to the power supply voltage is increased, thereby reducing the leakage current. This is a well-known technique.

Here, a configuration for supplying a potential different from a power supply voltage to a well substrate in a layout configuration of a semiconductor device in which standard cells are arranged side by side, will be described with reference to the following two conventional techniques.

(First Conventional Technique)

FIG. 13A is a plan view showing a layout configuration of a substrate power supply cell 1300 according to a first conventional technique. The substrate power supply cell 1300 has a power supply wiring 1310, a ground wiring 1315, and a substrate power supply wiring 1320. The substrate power supply wiring 1320 is connected to an upper-layer wiring at a substrate power supply connection portion 1330.

FIG. 13B is a cross-sectional view taken along line E-E of FIG. 13A. The power supply wiring 1310 is provided in a layer higher than the substrate power supply wiring 1320. The power supply wiring 1310 is not electrically connected to the substrate power supply wiring 1320 within the substrate power supply cell 1300.

FIG. 14 is a plan view showing a semiconductor device 1400 in which the substrate power supply cell 1300 and standard cells 1410 are arranged. The standard cell 1410 has a power supply wiring 1420, a ground wiring 1425, and a substrate power supply wiring 1430 as in the substrate power supply cell 1300, which are arranged side by side so that their power supply wirings or substrate power supply wirings are connected to each other. The power supply wiring 1420 is connected to the source of a transistor of the standard cell 1410, and the substrate power supply wiring 1430 is connected to the substrate of the transistor of the standard cell 1410. The standard cell 1410 also has at least one pair of input and output terminals. The standard cells 1410 are connected to each other via their input and output terminals. In FIG. 14, an output terminal 1440 and an input terminal 1450 are connected via a wiring and contacts. With this configuration, a potential different from a power supply voltage can be supplied to the substrate, thereby reducing a leakage current (see, for example, Japanese Patent Application Publication No. 2003-309178).

(Second Conventional Technique)

FIG. 15A is a plan view showing a semiconductor device 1500 according to a second conventional technique in which standard cells 1510 are arranged side by side. FIG. 15B is a cross-sectional view taken along F-F of FIG. 15A. Here, a power supply wiring 1520 and a substrate power supply wiring 1530 are connected via a contact 1540 to an upper-layer wiring. The power supply wiring 1520 and the substrate power supply wiring 1530 are also disposed at a boundary between cell rows, and are shared by adjacent standard cells 1510. The power supply wiring 1520 is connected to the source of a transistor of the standard cell 1510, and the substrate power supply wiring 1530 is connected to the substrate of the transistor of the standard cell 1510. With this configuration, a potential different from a power supply voltage can be supplied to the substrate, thereby reducing a leakage current (see, for example, US Patent Application Publication No. 2006/0181309).

The first conventional technique has the following problems. Specifically, the input and output terminals of the standard cell 1410 are disposed between the power supply wiring 1420 and the ground wiring 1425. As shown in FIG. 14, when the output terminal 1440 and the input terminal 1450 of adjacent standard cells are connected, a wiring connecting the output terminal 1440 and the input terminal 1450 needs to make a detour since the substrate power supply connection portion 1330 of the substrate power supply cell 1300 is disposed therebetween, though the output terminal 1440 and the input terminal 1450 have the same wiring track position. The detour wiring may pass through an upper wiring layer using contacts as shown in FIG. 14, or alternatively, may pass through the same wiring layer as shown in FIG. 16. In either case, a wiring resistance increases and therefore a wiring delay increases. In addition, the wiring detour deteriorates wiring efficiency in the vicinity of the substrate power supply cell 1300, leading to an increase in wiring delay of other wirings. If the substrate power supply wiring 1320 has a high resistance, and therefore, the substrate power supply cells 1300 should be spaced from each other by a short distance, the wiring detour frequently occurs, so that the timing design of the semiconductor device is adversely affected.

The second conventional technique has the following problem. Specifically, the power supply wiring 1520 has a narrow width at a connection portion in which the substrate power supply wiring 1530 is connected to the upper-layer wiring. In a miniaturization process, the resistance of the substrate power supply wiring 1530 increases, so that a large number of connection portions in which the substrate power supply wiring 1530 is connected to the upper-layer wiring need to be provided. In this case, the power supply wiring 1520 has a narrow width at a large number of portions. As the number of portions in which the power supply wiring 1520 has a narrow width increases, the wiring resistance of the power supply wiring 1520 increases, so that a voltage drop is more likely to occur during an operation of the semiconductor device, leading to an erroneous operation of the semiconductor device.

SUMMARY OF THE INVENTION

The present invention has been achieved to solve the problems described above. An object of the present invention is to provide a layout configuration of a semiconductor device in which a substrate control can be performed without reducing the wiring efficiency of a signal wiring, and a voltage drop of a power supply wiring can be suppressed.

To achieve the object, according to the present invention, a power supply connection portion is provided in a boundary portion of a cell, thereby improving the wiring efficiency of a signal wiring. Further, by setting the width of a power supply wiring in the cell to be larger than or equal to the width of a power supply wiring in other logic cells, a voltage drop is suppressed, thereby preventing an erroneous operation of a semiconductor device. A substrate potential is supplied via an upper-layer power supply wiring to the power supply connection portion, thereby changing a substrate potential so that a leakage current can be reduced.

The semiconductor device of the present invention has a layout configuration in which standard cells are arranged side by side, and a potential different from a power supply voltage can be supplied to a well substrate, so that a leakage current can be reduced and therefore, the power consumption of the semiconductor device can be reduced.

Also, the potential can be supplied to the well substrate without reducing signal wiring efficiency, resulting in a reduction in area of the semiconductor device. Also, the semiconductor device of the present invention has a power supply wiring configuration that can suppress a voltage drop, thereby making it possible to prevent an erroneous operation of the semiconductor device.

BRIEF DESCRIPTION OF THE DRAWINGS

FIG. 8 is a plan view showing a semiconductor device including the substrate power supply cell of FIG. 7.

DETAILED DESCRIPTION OF THE PREFERRED EMBODIMENTS

Hereinafter, embodiments of the present invention will be described with reference to the accompanying drawings.

First Embodiment

Figure 1A:
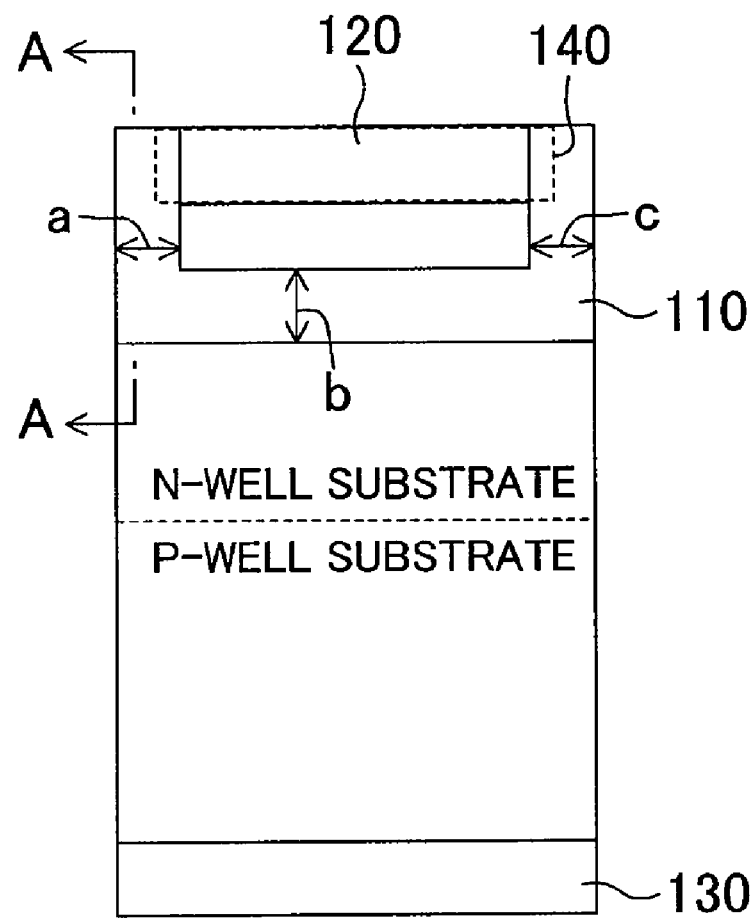
FIG. 1A is a plan view showing an exemplary substrate power supply cell according to a first embodiment of the present invention.

FIG. 1A shows a layout configuration of a substrate power supply cell 100 according to a first embodiment of the present invention. In FIG. 1A, the substrate power supply cell 100 is divided at a middle thereof into an N-well substrate region and a P-well substrate region. The substrate power supply cell 100 also has a power supply wiring 110, a substrate power supply wiring 120, and a ground wiring 130. The power supply wiring 110 is formed of a lowermost wiring layer, and the substrate power supply wiring 120 is formed of an impurity diffusion layer.

Figure 1B:
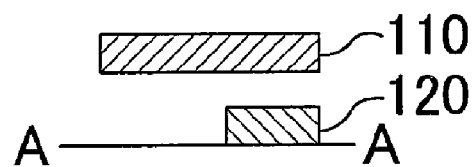
FIG. 1B is a cross-sectional view taken along line A-A of FIG. 1A.

FIG. 1B shows a cross-sectional view taken along A-A of FIG. 1A. The power supply wiring 110 and the substrate power supply wiring 120 are not electrically connected in the substrate power supply cell 100. The substrate power supply wiring 120 is connected via a contact to an upper-layer wiring at a substrate power supply connection portion 140 that is a portion of the substrate power supply wiring 120. Widths a, b and c of the power supply wiring 110 are all the same.

Figure 2:
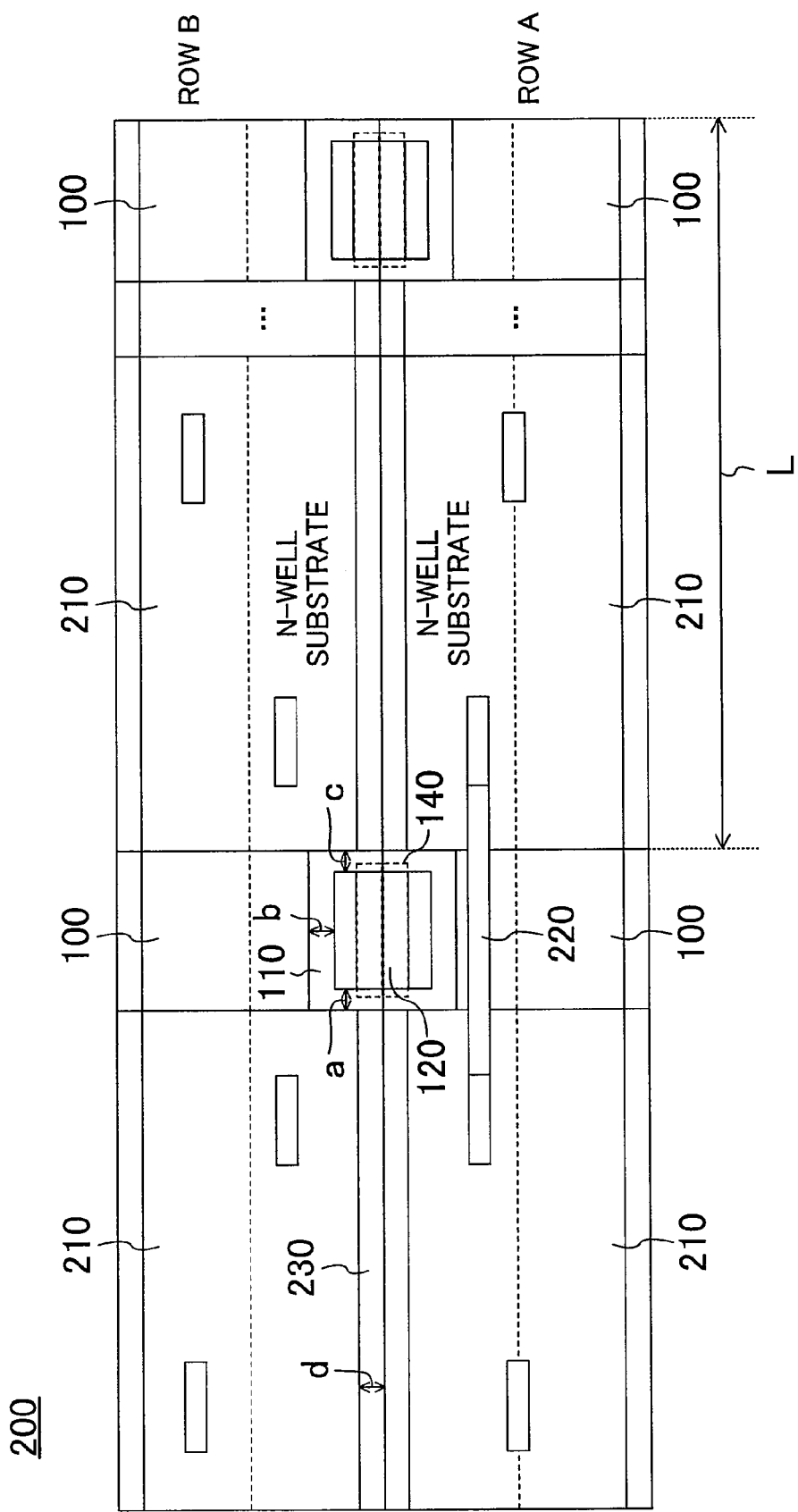
FIG. 2 is a plan view showing a semiconductor device including substrate power supply cells of FIGS. 1A and 1B.

FIG. 2 shows a layout configuration of a semiconductor device 200 in which the substrate power supply cells 100 and standard cells 210 are arranged side by side without a spacing between each row, and input and output terminals of adjacent standard cells 210 are connected via a signal wiring 220. The standard cell 210 has a power supply wiring 230 having the same width as that of the power supply wiring 110 of the substrate power supply cell 100, where widths a, b, c and d are all the same. Also, a substrate power supply wiring is provided below and in parallel to the power supply wiring 230 and is connected to the substrate power supply wiring 120 of the substrate power supply cell 100, though not shown in FIG. 2. The input and output terminals of the standard cell 210 are formed of a wiring layer immediately above the power supply wiring 230. The substrate power supply wiring in the standard cell 210 is connected to an N-well substrate in the standard cell 210. The standard cell 210 in a row B is flipped vertically with respect to the standard cell 210 in a row A, and both the standard cells 210 share an N-well substrate region. The substrate power supply cells 100 share the substrate power supply connection portion 140. The substrate power supply cells 100 are repeatedly arranged with a constant spacing L or less between each thereof while design conditions are satisfied by the resistance of the substrate power supply wiring 120.

Figure 3:
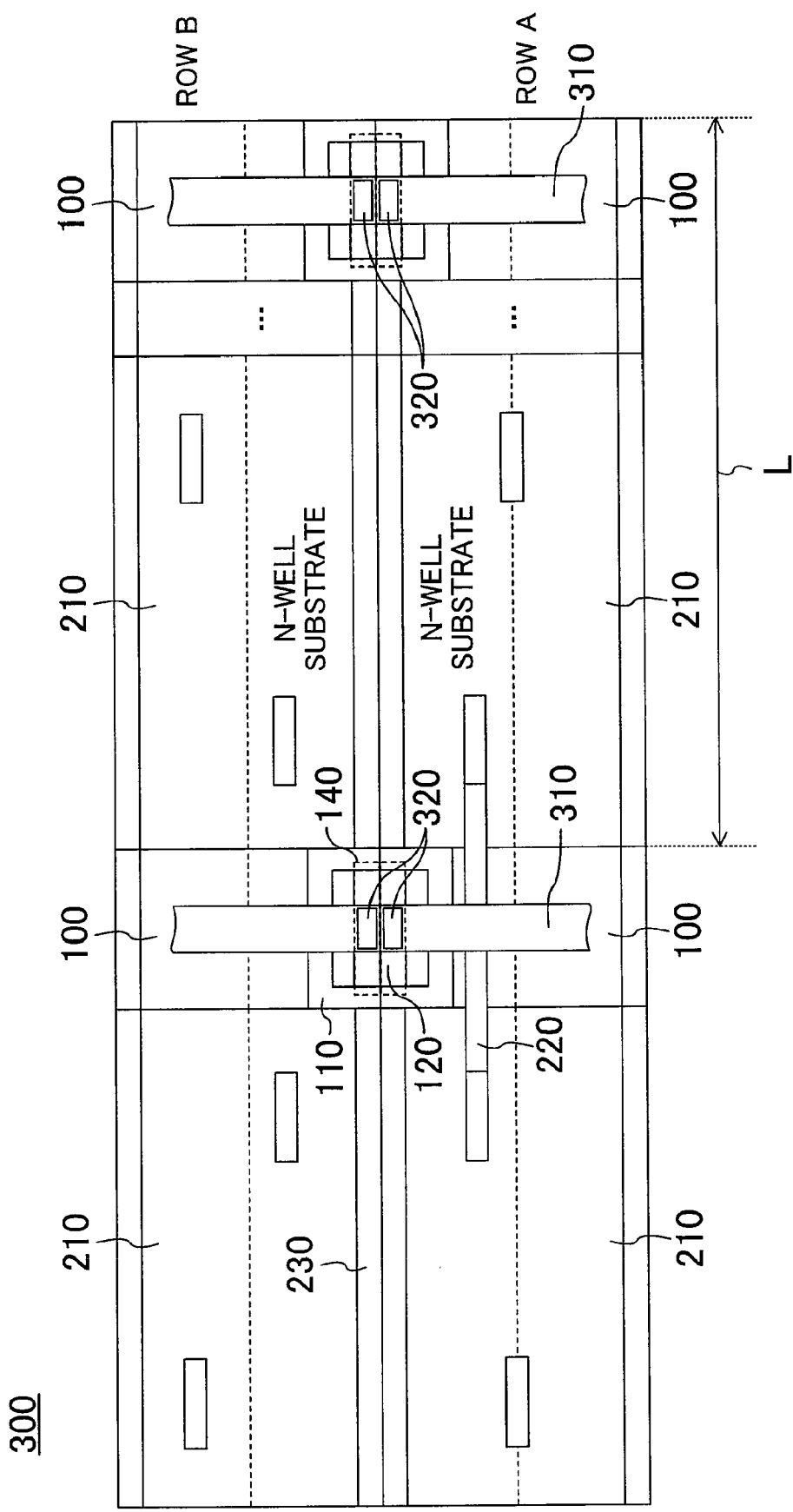
FIG. 3 is a plan view showing the semiconductor device of FIG. 2 to which an upper-layer substrate power supply wiring is added.

FIG. 3 shows a layout configuration of a semiconductor device 300 including an upper-layer substrate power supply wiring 310 in addition to the parts of FIG. 2. The substrate power supply connection portion 140 is connected via a contact 320 to the upper-layer substrate power supply wiring 310. By changing a voltage applied to the upper-layer substrate power supply wiring 310, the N-well substrate potential of the standard cell 210 can be changed, thereby reducing a leakage current.

With a configuration as shown in FIG. 3, the substrate power supply connection portion 140 is disposed in a boundary region between each cell, so that the signal wiring 220 can have a shortest length without taking a detour as in the first conventional technique. Since it is possible to avoid an increase in the number of contacts or the length of a wiring required for a detour, an increase in wiring delay can be suppressed.

Also, it is possible to avoid a deterioration in wiring efficiency in the vicinity of the substrate power supply cell 100 due to a detour occurring in the first conventional technique.

Also, the power supply wiring 230 of the standard cell 210 and the power supply wiring 110 of the substrate power supply cell 100 invariably have the same width. Therefore, as compared to the second conventional technique, a voltage drop of the power supply wiring can be avoided, so that the semiconductor device can be operated stably.

In this embodiment, the power supply wiring 110 is formed of a lowermost wiring layer and the substrate power supply wiring 120 is formed of an impurity diffusion layer. Alternatively, a power supply wiring may be formed of a wiring layer immediately above or further higher than the lowermost layer and a substrate power supply wiring may be formed of the lowermost wiring layer. Also, a power supply wiring may be formed of the impurity diffusion layer and a substrate power supply wiring may be formed of the N-well substrate.

Figure 4:
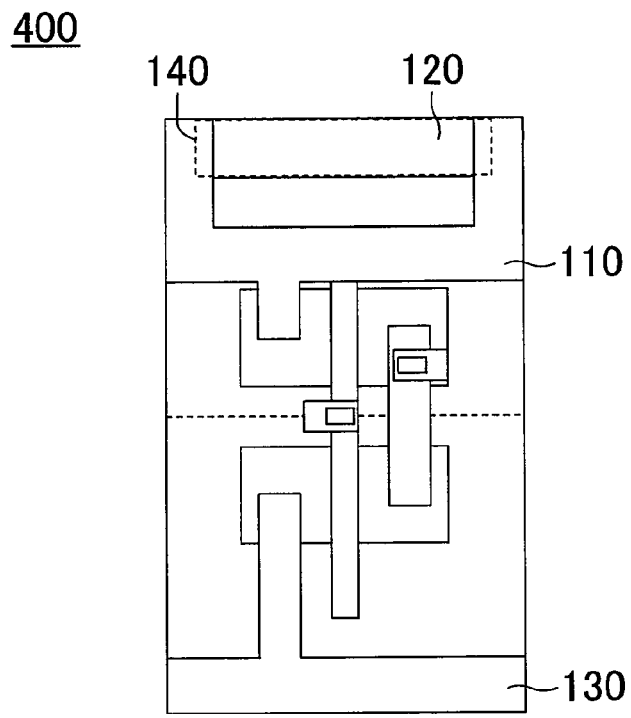
FIG. 4 is a plan view showing another exemplary substrate power supply cell according to the first embodiment of the present invention.

Also, in this embodiment, the substrate power supply cell 100 does not have a logic function. Alternatively, as shown in FIG. 4, a substrate power supply cell 400 having a layout configuration with an inverter function may be contemplated. Not only an inverter but also a buffer or the like may be provided. With this configuration, the inverter of the substrate power supply cell 400 can be substituted for a layout modification inverter that is provided as a spare cell for layout modification in a semiconductor device. Thereby, the number of inverters for modification can be decreased, so that a region where the modification inverters are provided can be decreased, resulting in a reduction in area of a semiconductor device.

Figure 5:
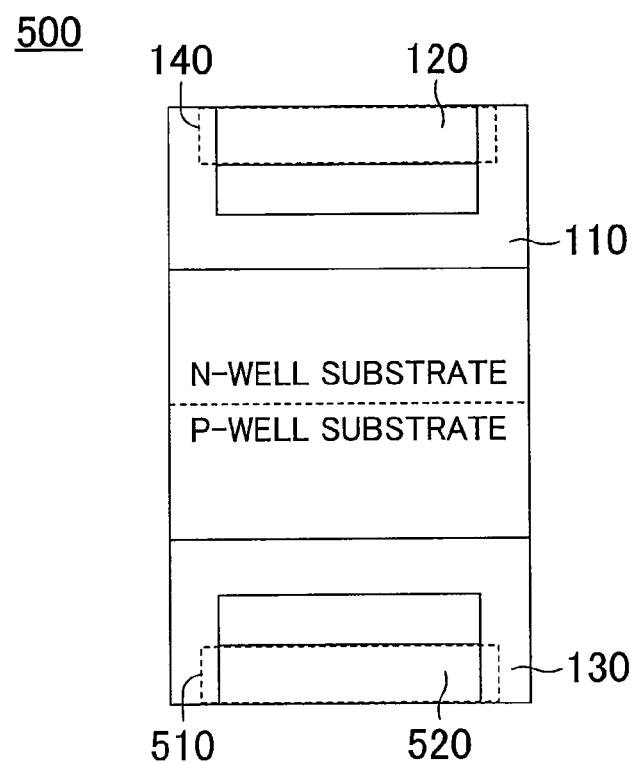
FIG. 5 is a plan view showing still another exemplary substrate power supply cell according to the first embodiment of the present invention.
Figure 6:
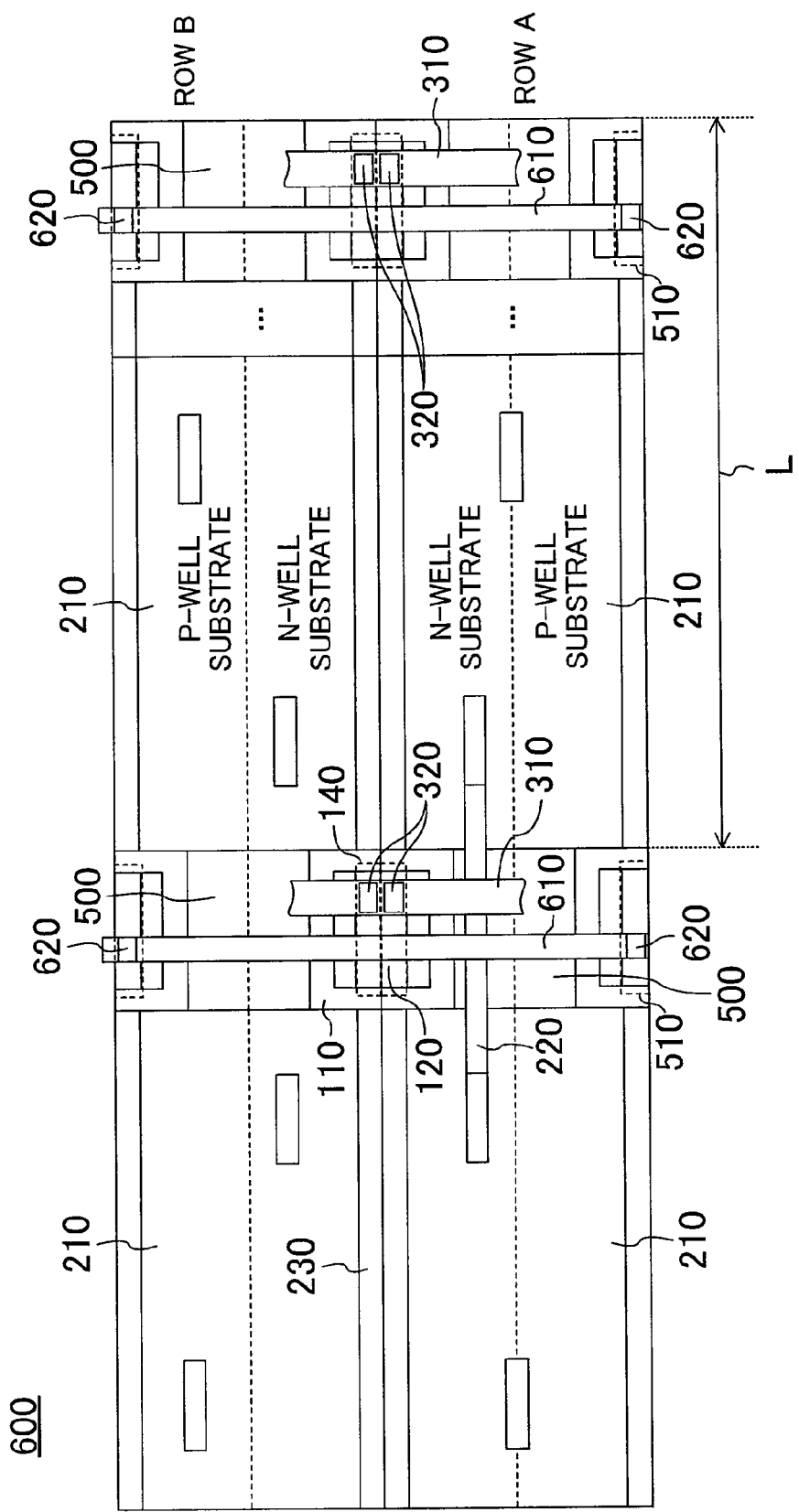
FIG. 6 is a plan view showing a semiconductor device including the substrate power supply cell of FIG. 5.

Also, in this embodiment, the substrate power supply cell 100 in which only the N-well substrate region can be controlled, has been shown. Alternatively, as shown in FIG. 5, a substrate power supply cell 500 in which both the N-well substrate region and the P-well substrate region can be controlled, can be provided. A substrate power supply wiring 520 having a substrate power supply connection portion 510 is provided in the P-well substrate region. FIG. 6 shows a semiconductor device 600 in which the substrate power supply cells 500 and the standard cells 210 are arranged side by side. The semiconductor device 600 also includes upper-layer substrate power supply wirings 310 and 610 and contacts 320 and 620. With this configuration, the substrate potentials of both the N-well substrate region and the P-well substrate region can be controlled, resulting in a higher reduction effect of the leakage current.

Figure 7:
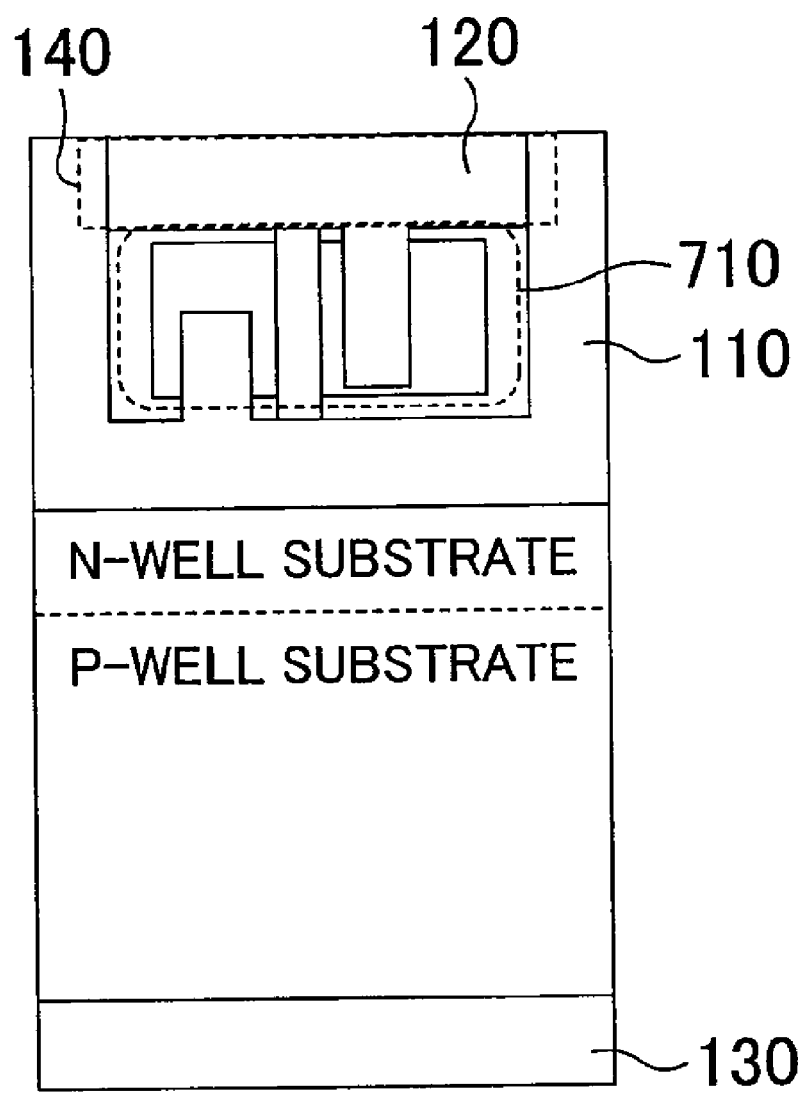
FIG. 7 is a plan view showing still another exemplary substrate power supply cell according to the first embodiment of the present invention.

Also, a layout configuration may be contemplated in which, as shown in FIG. 7, a switch for switching on/off an electrical connection between the power supply wiring 110 and the substrate power supply connection portion 140, is added to the substrate power supply cell of this embodiment. In the substrate power supply cell 700 of FIG. 7, the switch may include a P-channel transistor 710, for example. By changing the gate potential of the P-channel transistor 710, the electrical connection between the power supply wiring 110 and the substrate power supply connection portion 140 can be switched on/off. FIG. 8 shows a semiconductor device 800 in which the substrate power supply cells 700 and the standard cells 210 are arranged side by side. The semiconductor device 800 includes an upper-layer power supply wiring (not shown) for supplying a power supply potential via a contact to the power supply wiring 230 of the standard cell 210. When the switch including the P-channel transistor 710 is off, the power supply wiring 110 and the substrate power supply wiring 120 are not electrically connected, so that their potentials can be separately controlled. Therefore, a leakage current can be reduced by a potential control of the N-well substrate. When the switch is on, the power supply wiring 110 and the substrate power supply wiring 120 are electrically connected. In this case, by supplying a power supply potential to the upper-layer substrate power supply wiring 310, the power supply potential is also supplied to the power supply wiring 110. Therefore, when it is not necessary to control the substrate potential, a power supply potential is supplied to the power supply wiring 230 of the standard cell 210 not only from the upper-layer power supply wiring (not shown), but also from the upper-layer substrate power supply wiring 310. Therefore, an erroneous operation of a semiconductor device due to a voltage drop can be avoided to further extent.

Second Embodiment

Figure 9A:
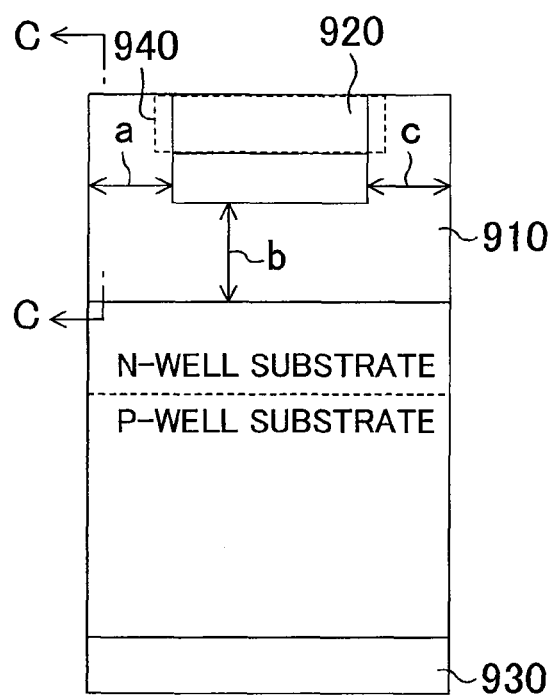
FIG. 9A is a plan view showing a first-type substrate power supply cell according to a second embodiment of the present invention.
Figure 9B:
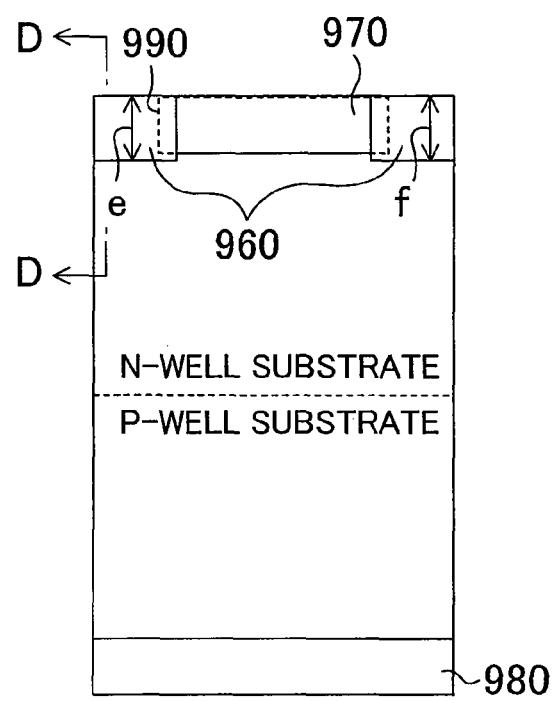
FIG. 9B is a plan view showing a second-type substrate power supply cell according to the second embodiment of the present invention.

FIG. 9A shows a layout configuration of a first-type substrate power supply cell 900 according to a second embodiment of the present invention, and FIG. 9B shows a layout configuration of a second-type substrate power supply cell 950 according to the second embodiment. In FIGS. 9A and 9B, the substrate power supply cells 900 and 950 are each divided into an N-well substrate region and a P-well substrate region in a middle thereof.

In FIG. 9A, the first-type substrate power supply cell 900 has a power supply wiring 910, a substrate power supply wiring 920, and a ground wiring 930. The power supply wiring 910 is formed of a lowermost wiring layer, and the substrate power supply wiring 920 is formed of an impurity diffusion layer.

Figure 9C:
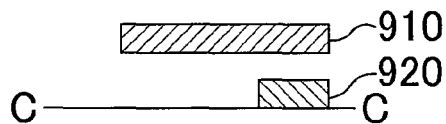
FIG. 9C is a cross-sectional view taken along line C-C of FIG. 9A.

FIG. 9C shows a cross-sectional view taken along line C-C of FIG. 9A. The power supply wiring 910 and the substrate power supply wiring 920 are not electrically connected. The substrate power supply wiring 920 is connected to an upper-layer wiring via a contact at a substrate power supply connection portion 940 that is a portion of the substrate power supply wiring 920. Widths a, b and c of the power supply wiring 910 are all the same.

In FIG. 9B, the second-type substrate power supply cell 950 has a power supply wiring 960, a substrate power supply wiring 970, and a ground wiring 980. The power supply wiring 960 is formed of a lowermost wiring layer, and the substrate power supply wiring 970 is formed of an impurity diffusion layer.

Figure 9D:
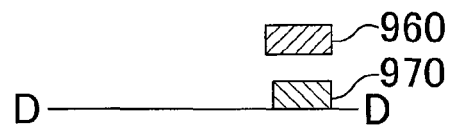
FIG. 9D is a cross-sectional view taken along line D-D of FIG. 9B.

FIG. 9D shows a cross-sectional view taken along line D-D of FIG. 9B. The power supply wiring 960 and the substrate power supply wiring 970 are not electrically connected. The substrate power supply wiring 970 is connected to an upper-layer wiring via a contact at a substrate power supply connection portion 990 that is a portion of the substrate power supply wiring 970. Widths e and f of the power supply wiring 960 are all the same.

Figure 10:
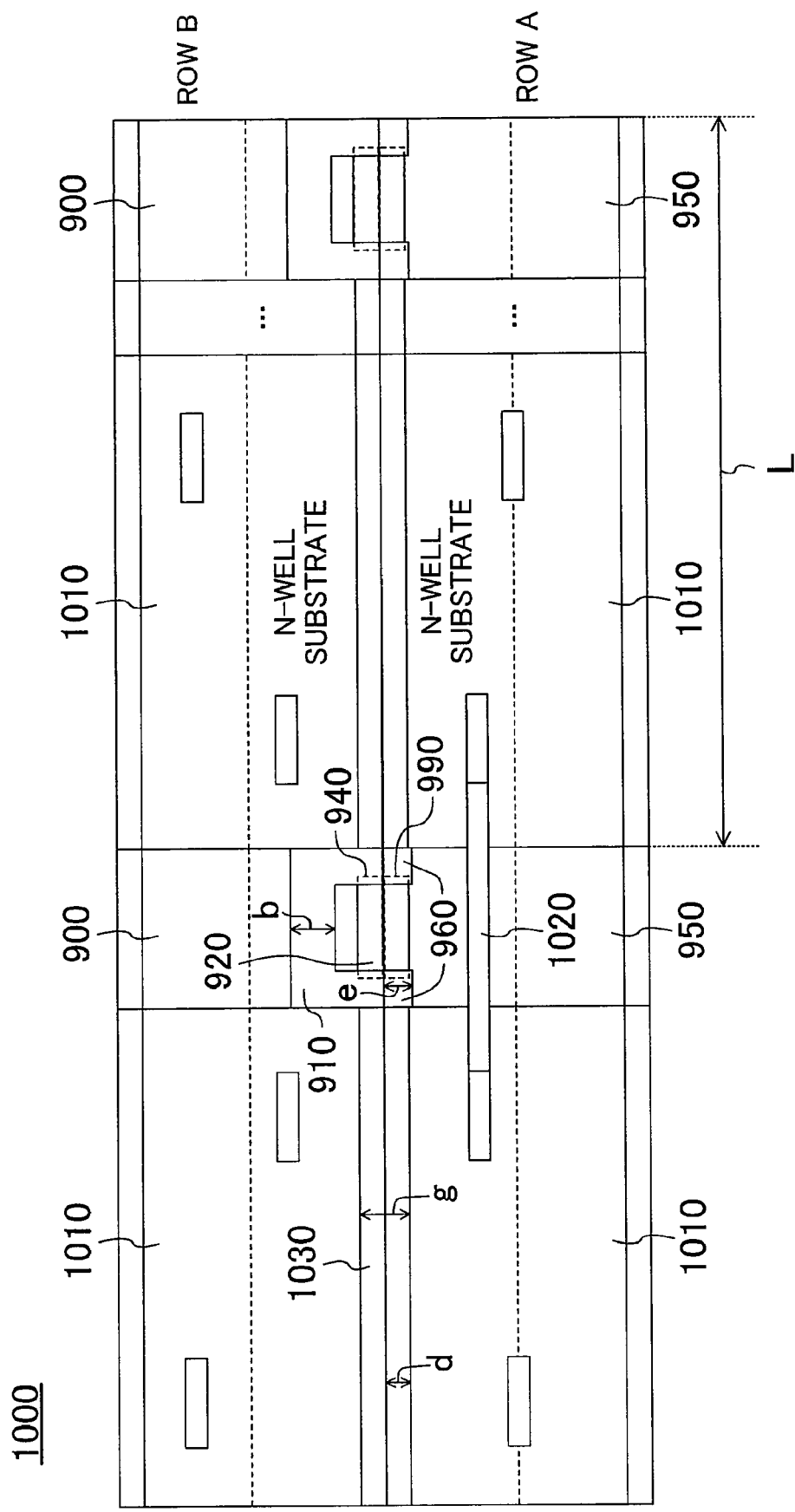
FIG. 10 is a plan view showing an exemplary semiconductor device including the first-type substrate power supply cell of FIGS. 9A and 9C and the second-type substrate power supply cell of FIGS. 9B and 9D.

FIG. 10 shows a layout configuration of a semiconductor device 1000 in which the first-type and second-type substrate power supply cells 900 and 950 and standard cells 1010 are arranged side by side without a spacing between each row, and input and output terminals of adjacent standard cells 1010 are connected with a signal wiring 1020. The standard cell 1010 has a power supply wiring 1030 having substantially the same width as that of the power supply wiring 960 of the second-type substrate power supply cell 950. Widths d and e of the power supply wiring 1030 have substantially the same value. A width b of the power supply wiring 910 of the first-type substrate power supply cell 900 is substantially equal to a width g that is double the width d of the power supply wiring 1030 of the standard cell 1010. The standard cell 1010 in a row B is flipped vertically with respect to the standard cell 1010 in a row A, and both the standard cells 1010 share an N-well substrate region. The first-type substrate power supply cell 900 and the second-type substrate power supply cell 950 share the substrate power supply connection portions 940 and 990. The first-type substrate power supply cell 900 and the second-type substrate power supply cell 950 are repeatedly arranged with a constant spacing L between each thereof while design conditions are satisfied by the resistances of the substrate power supply wirings 920 and 970.

Figure 11:
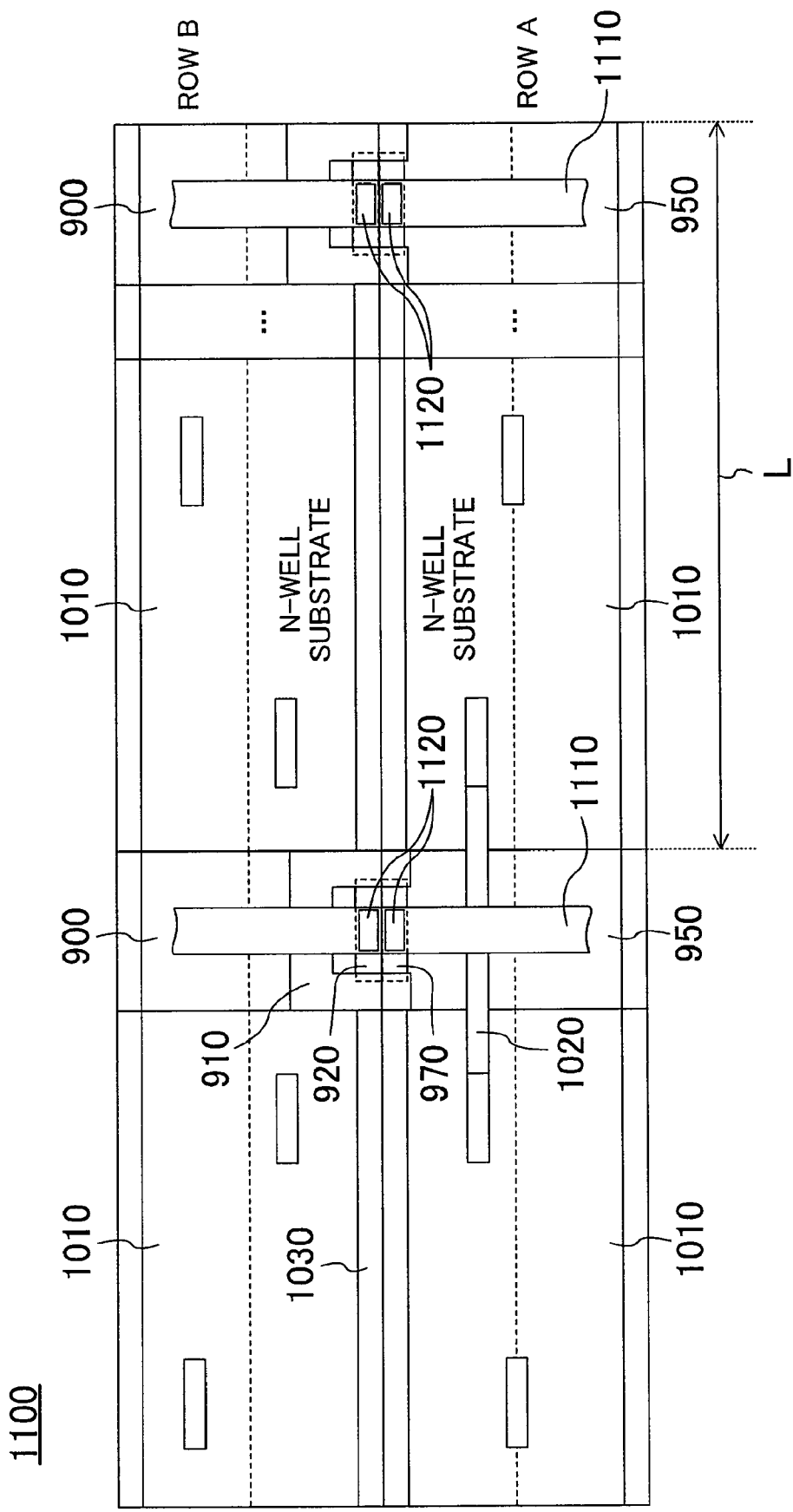
FIG. 11 is a plan view showing the semiconductor device of FIG. 10 to which an upper-layer substrate power supply wiring is added.

FIG. 11 shows a layout configuration of a semiconductor device 1100 obtained by adding an upper-layer substrate power supply wiring 1110 to the layout configuration of FIG. 10. The substrate power supply connection portions 940 and 990 are connected via contacts 1120 to the upper-layer substrate power supply wiring 1110. By changing a voltage applied to the upper-layer substrate power supply wiring 1110, the N-well substrate potential of the standard cell 1010 can be changed, thereby reducing a leakage current.

With a configuration as shown in FIG. 11, since the substrate power supply connection portions 940 and 990 are disposed in a boundary region between each cell, the signal wiring 1020 does not take a detour as is different from the first conventional technique. It is therefore possible to avoid a contact required for a detour or an increase in wiring length due to a detour, so that an increase in wiring delay can be suppressed. It is also possible to avoid a deterioration in wiring efficiency in the vicinity of the substrate power supply cells 900, 950 that would otherwise occur due to a detour. Also, with a configuration as shown in FIG. 11, as compared to the second conventional technique, it is possible to avoid a voltage drop of the power supply wiring, so that the semiconductor device can be stably operated.

Figure 12:
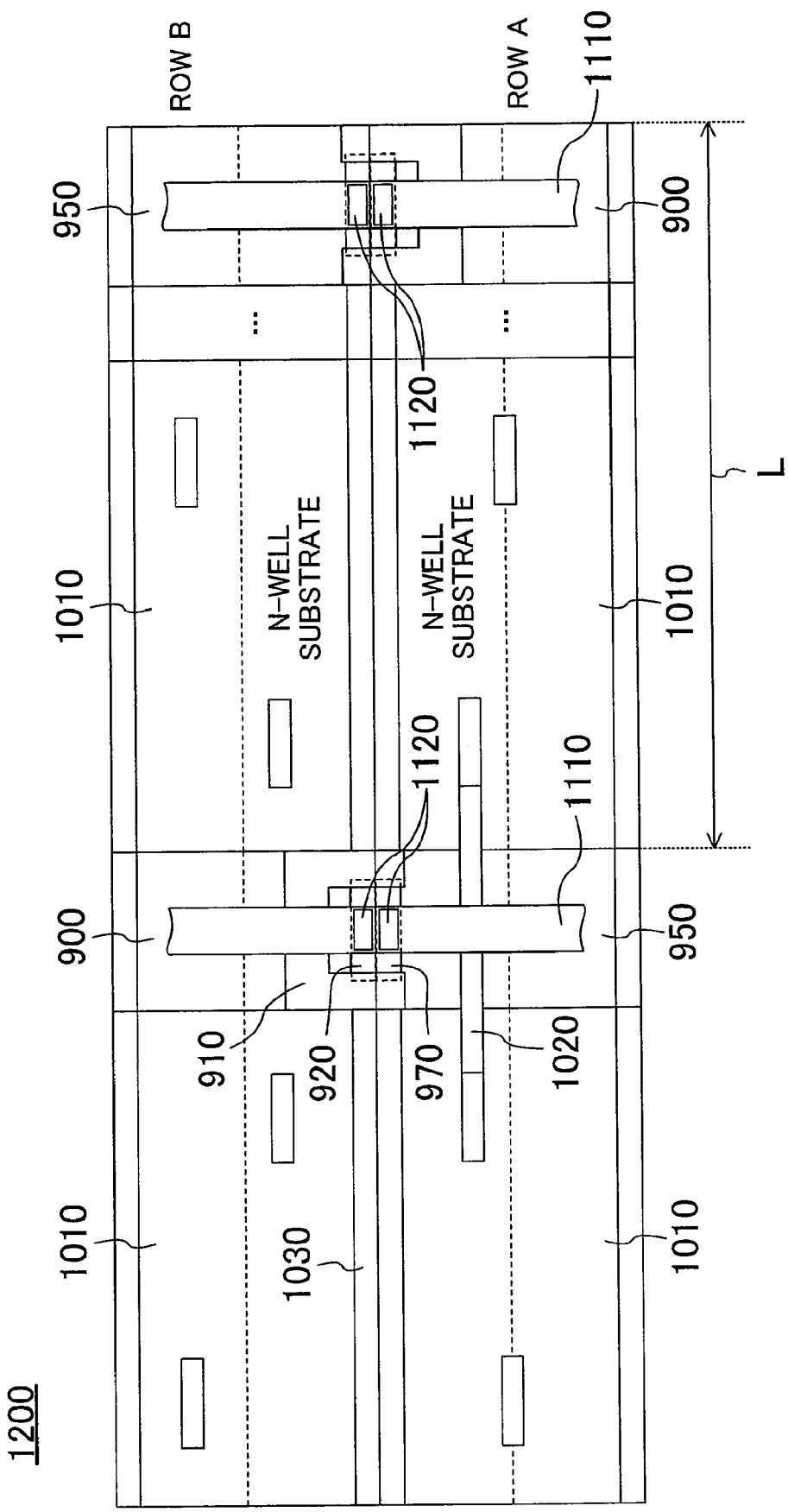
FIG. 12 is a plan view showing another exemplary semiconductor device including the first-type substrate power supply cell of FIGS. 9A and 9C and the second-type substrate power supply cell of FIGS. 9B and 9D.
Figure 13A:
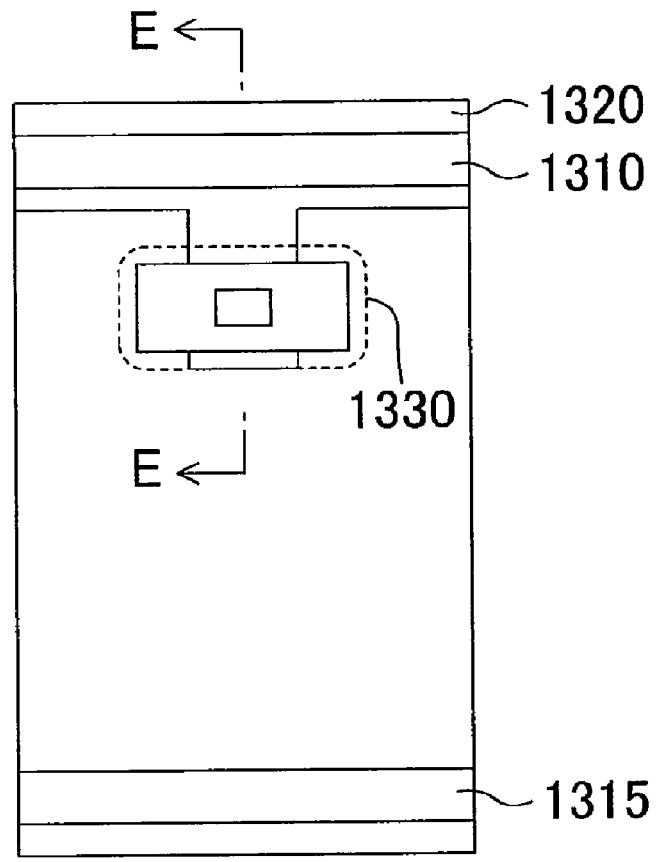
FIG. 13A is a plan view showing a substrate power supply cell according to a first conventional technique.
Figure 13B:
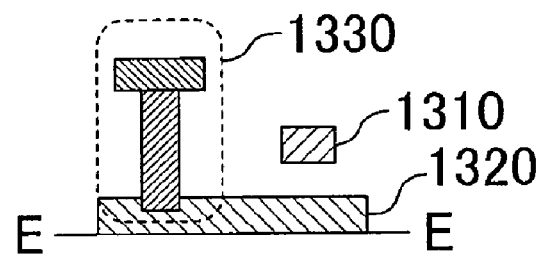
FIG. 13B is a cross-sectional view taken along line E-E of FIG. 13A.
Figure 14:
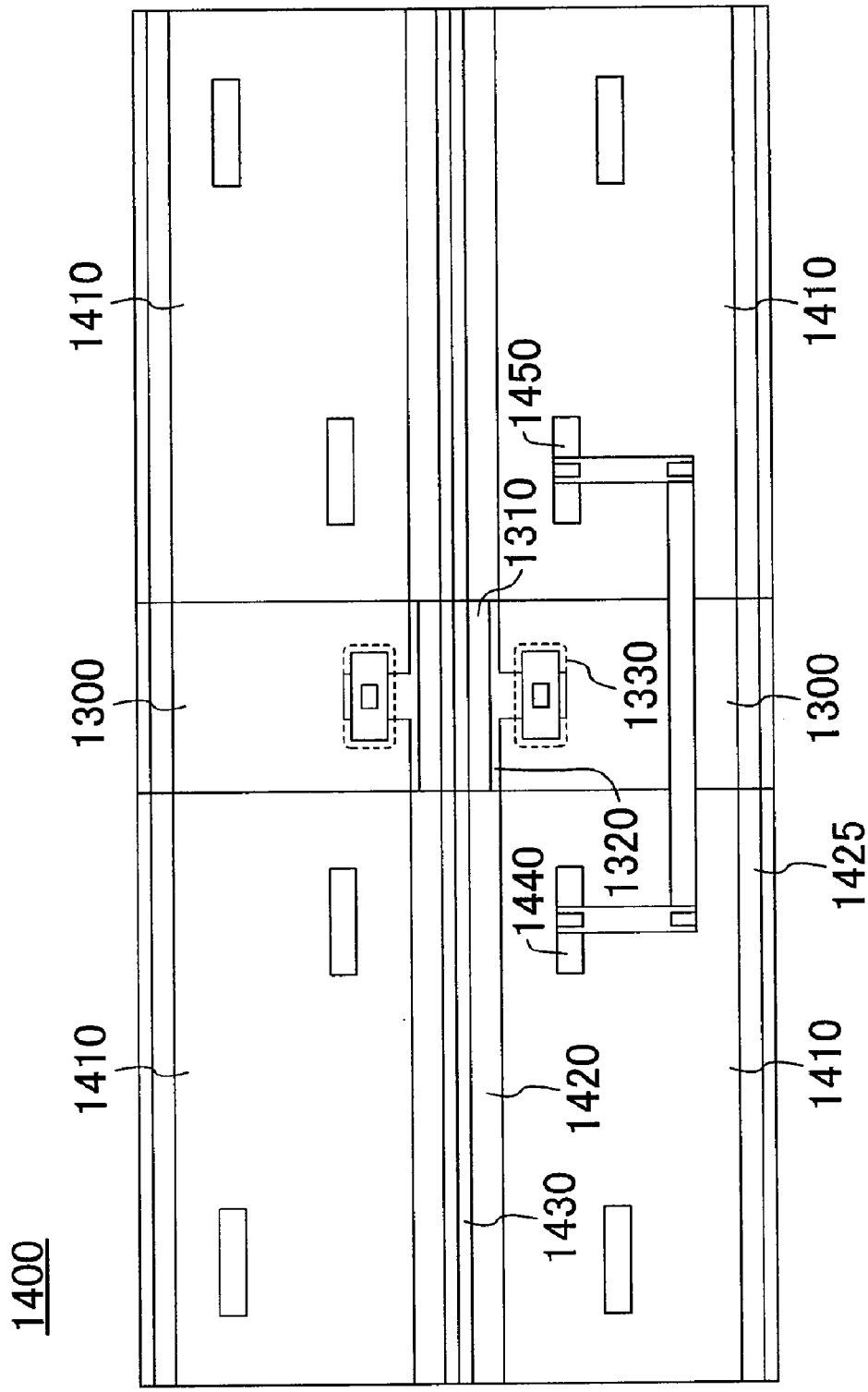
FIG. 14 is a plan view showing an exemplary conventional semiconductor device including the substrate power supply cell of FIGS. 13A and 13B.
Figure 15A:
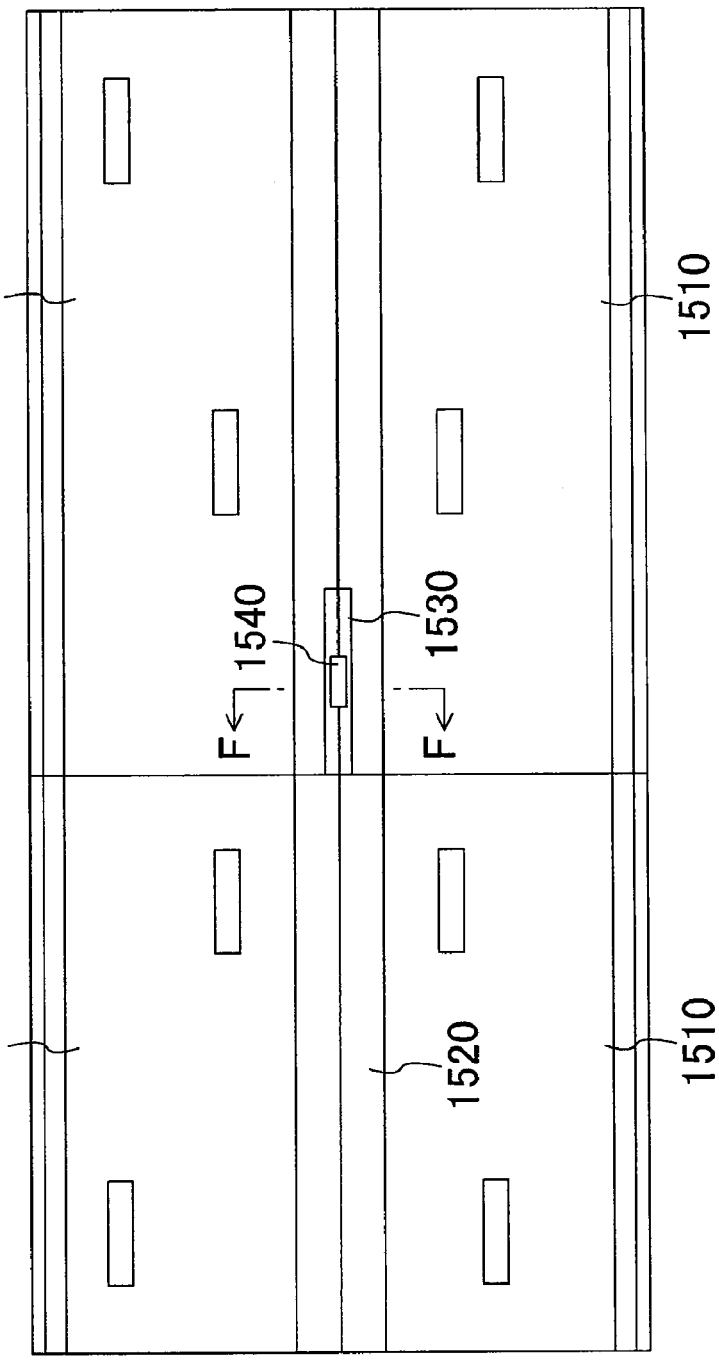
FIG. 15A is a plan view showing a semiconductor device according to a second conventional technique.
Figure 15B:
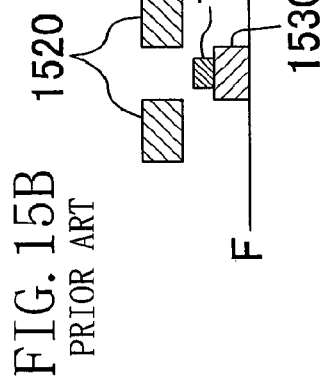
FIG. 15B is a cross-sectional view taken along line F-F of FIG. 15A.
Figure 16:
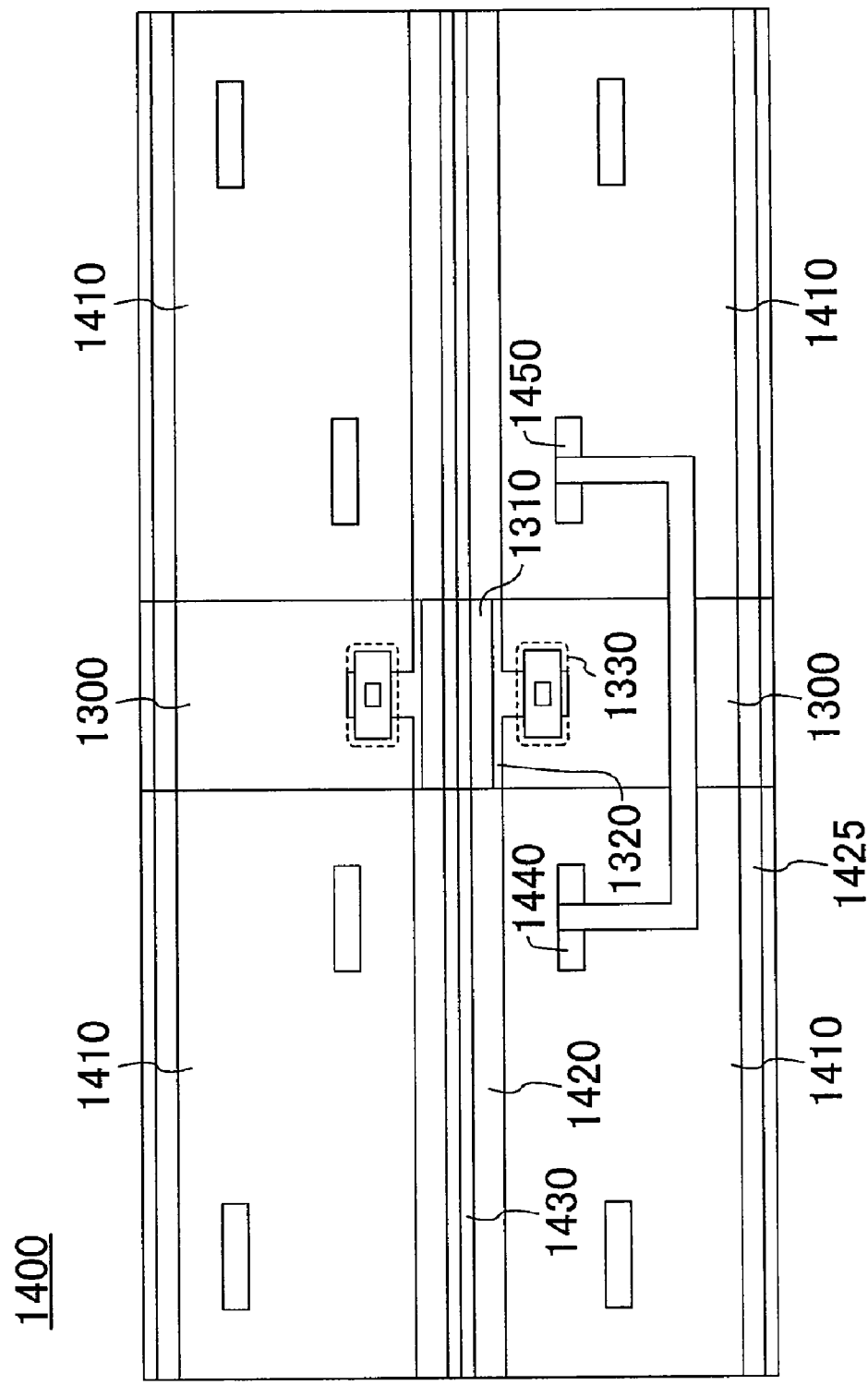
FIG. 16 is a plan view showing another exemplary conventional semiconductor device including the substrate power supply cell of FIGS. 13A and 13B.

In this embodiment, the first-type substrate power supply cell 900 is disposed in the row B, and the second-type substrate power supply cell 950 is disposed in the row A. Alternatively, the substrate power supply cells 900 and 950 may be disposed in a staggered pattern as in a semiconductor device 1200 shown in FIG. 12.

As described above, in the semiconductor device of the present invention, which has a layout configuration in which standard cells are arranged side by side, a potential different from the power supply voltage can be supplied to the well substrate, so that a leakage current can be reduced. Therefore, the power consumption of the semiconductor device can be effectively reduced.

Also, since the potential can be supplied to the well substrate without reducing the signal wiring efficiency, the area of the semiconductor device can be effectively reduced.

What is claimed is:

1. A semiconductor device having an upper-layer power supply wiring formed in an upper layer within the semiconductor device, a first power supply cell, and a second power supply cell, wherein the first and second power supply cells each have a power supply wiring and a power supply connection portion, the power supply connection portion is provided in a boundary portion of each of the first and second power supply cells, the power supply wiring is formed in an upper layer higher than the power supply connection portion in the semiconductor device, the power supply wiring and the power supply connection portion partially overlap as the semiconductor device is viewed from the top, the power supply connection portion is electrically connected via a contact to the upper-layer power supply wiring provided in the upper layer higher than the power supply wiring, the power supply wiring of the first power supply cell has a width larger than or equal to a width of an intra-cell power supply wiring in another logic cell in the semiconductor device, and the power supply wiring of the second power supply cell has a width larger than a width of the power supply wiring of the first power supply cell.

2. The semiconductor device of claim 1, wherein
the power supply connection portion includes a wiring formed of an impurity diffusion layer,
the power supply wiring includes a wiring formed of a wiring layer, and
the power supply connection portion and the power supply wiring are not electrically connected to each other in each of the first and second power supply cells.

3. The semiconductor device of claim 1, wherein
the power supply connection portion includes a wiring formed of a wiring layer,
the power supply wiring includes a wiring formed of a wiring layer in an upper layer higher than the wiring of the power supply connection portion, and
the power supply connection portion and the power supply wiring are not electrically connected to each other in each of the first and second power supply cells.

4. The semiconductor device of claim 1, wherein
the power supply connection portion includes an N-well substrate or a P-well substrate of the semiconductor device,
the power supply wiring includes a wiring of an impurity diffusion layer or a wiring of a wiring layer, and
the power supply connection portion and the power supply wiring are not electrically connected to each other in each of the first and second power supply cells.

5. The semiconductor device of claim 1, wherein a wiring direction of the upper-layer power supply wiring and a wiring direction of a wiring of the power supply connection portion are orthogonal to each other.

6. The semiconductor device of claim 1, wherein the first and second power supply cells each supply a substrate potential via the upper-layer power supply wiring to a substrate of a cell in the semiconductor device.

7. The semiconductor device of claim 1, wherein
the semiconductor device has a configuration in which cells are arranged side by side without a spacing between each row,
the first power supply cells are arranged with a predetermined specific spacing between each thereof, in a first row,
the second power supply cells are arranged with a predetermined specific spacing between each thereof, in a second row adjacent to the first row,
the first and second power supply cells are arranged in columns, and the power supply connection portion of the upper or lower power supply cell joins or overlaps with the upper-layer power supply wiring, so that the power supply connection portion and the upper-layer power supply wiring share a contact connecting therebetween.

8. The semiconductor device of claim 1, wherein the semiconductor device has a configuration in which cells are arranged side by side without a spacing between each row, the first power supply cells are arranged with a predetermined specific spacing between each thereof, in a staggered pattern, the second power supply cells are arranged with a predetermined specific spacing between each thereof, in a staggered pattern, the first and second power supply cells are arranged in columns, and the power supply connection portion of the upper or lower power supply cell joins or overlaps with the upper-layer power supply wiring, so that the power supply connection portion and the upper-layer power supply wiring share a contact connecting therebetween.

* * * * *